(12) United States Patent
Lin et al.

(10) Patent No.: US 12,387,768 B2
(45) Date of Patent: Aug. 12, 2025

(54) MEMORY DEVICE INCLUDING SEPARATE NEGATIVE BIT LINE

(71) Applicant: Taiwan Semiconductor Manufacturing Company, Ltd., Hsinchu (TW)

(72) Inventors: Chih-Yu Lin, Taichung (TW); Yi-Hsin Nien, Hsinchu (TW); Hidehiro Fujiwara, Hsinchu (TW); Yen-Huei Chen, Jhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 117 days.

(21) Appl. No.: 18/170,426

(22) Filed: Feb. 16, 2023

(65) Prior Publication Data

US 2024/0105241 A1   Mar. 28, 2024

Related U.S. Application Data

(60) Provisional application No. 63/410,002, filed on Sep. 26, 2022.

(51) Int. Cl.
*G11C 7/12* (2006.01)
*G11C 7/18* (2006.01)
*G11C 7/22* (2006.01)

(52) U.S. Cl.
CPC .................. *G11C 7/12* (2013.01); *G11C 7/18* (2013.01); *G11C 7/222* (2013.01)

(58) Field of Classification Search
CPC .............. G11C 7/12; G11C 7/18; G11C 7/222

USPC ...................................................... 365/185.13
See application file for complete search history.

(56) References Cited

U.S. PATENT DOCUMENTS

| | | | |
|---|---|---|---|
| 4,807,195 A | 2/1989 | Busch et al. | |
| 5,701,269 A * | 12/1997 | Fujii | G11C 7/18 365/185.21 |
| 5,917,745 A * | 6/1999 | Fujii | G11C 7/18 365/205 |
| 6,091,629 A * | 7/2000 | Osada | G06F 12/0802 365/220 |
| 7,525,844 B2 | 4/2009 | Edahiro | |
| 2001/0002882 A1* | 6/2001 | Shimazaki | G11C 11/419 365/206 |
| 2003/0086315 A1 | 5/2003 | Mizuno et al. | |

(Continued)

FOREIGN PATENT DOCUMENTS

CN          114730586 A    7/2022

OTHER PUBLICATIONS

Office Action issued in connection with Taiwan Appl. No. 112128023 dated Apr. 18, 2024.

*Primary Examiner* — Sung Il Cho
(74) *Attorney, Agent, or Firm* — FOLEY & LARDNER LLP

(57) ABSTRACT

Disclosed herein are related to a memory device. In one aspect, a memory device includes a set of memory cells. In one aspect, the memory device includes a first bit line extending along a direction. The first bit line may be coupled to a subset of the set of memory cells disposed along the direction. In one aspect, the memory device includes a second bit line extending along the direction. In one aspect, the memory device includes a switch coupled between the first bit line and the second bit line.

20 Claims, 8 Drawing Sheets

(56) References Cited

U.S. PATENT DOCUMENTS

| | | | |
|---|---|---|---|
| 2008/0151653 A1* | 6/2008 | Ishikura | G11C 29/12 |
| | | | 365/201 |
| 2009/0273961 A1* | 11/2009 | Ono | G11C 13/00 |
| | | | 365/189.011 |
| 2009/0285032 A1 | 11/2009 | Choi | |
| 2012/0206988 A1* | 8/2012 | Song | G11C 7/12 |
| | | | 365/189.011 |
| 2012/0230141 A1* | 9/2012 | Mochida | G11C 11/4097 |
| | | | 365/207 |
| 2019/0273084 A1* | 9/2019 | Wang | H01L 23/522 |
| 2020/0327924 A1* | 10/2020 | Cosemans | G11C 11/4087 |

* cited by examiner

700

Disable a switch between a first bit line and a second bit line during a first time period
710

Apply a data voltage to a memory cell during the first time period
720

Enable the switch during a second time period
730

Apply an assist voltage lower than the data voltage to the memory cell during the second time period
740

Fig. 7

MEMORY DEVICE INCLUDING SEPARATE NEGATIVE BIT LINE

CROSS-REFERENCE TO RELATED APPLICATIONS

The present application claims the benefit of and priority to U.S. Provisional Patent App. No. 63/410,002, filed Sep. 26, 2022, the entire disclosure of which is incorporated by reference herein.

BACKGROUND

Developments in electronic devices, such as computers, portable devices, smart phones, internet of thing (IoT) devices, etc., have prompted increased demands for memory devices. In general, memory devices may be volatile memory devices or non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a flowchart showing a method of operating a memory device including separate negative bit lines, in accordance with some embodiments.

DETAILED DESCRIPTION

Figure 1:
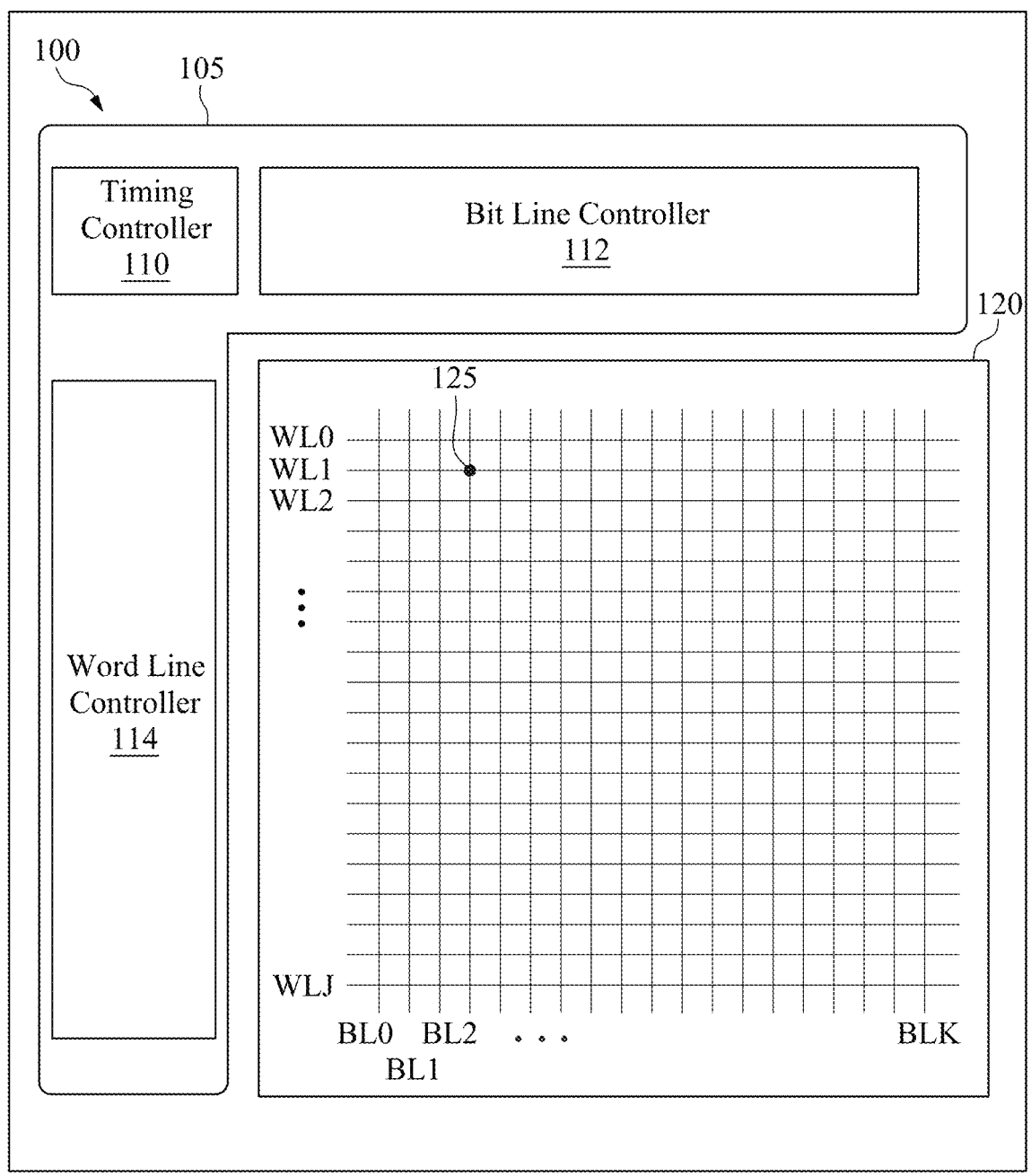
FIG. 1 illustrates a schematic block diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are related to a memory device including bit lines and separate negative bit lines. In one aspect, a memory device includes a set of memory cells. In one aspect, the memory device includes a bit line extending along a direction. A bit line may be one or more metal rails electrically coupled to each other to provide a voltage for writing data at one or more memory cells. The bit line may be coupled to a subset of the set of memory cells disposed along the direction. In one aspect, the memory device includes a negative bit line extending along the direction. A negative bit line may be one or more metal rails electrically coupled to each other to provide a negative voltage to assist writing data at one or more memory cells. In one aspect, the negative bit line may have a lower resistance than the bit line. In one aspect, the memory device includes a switch to selectively couple the bit line to the negative bit line.

Advantageously, the disclosed memory device can improve consistency and reliability of operation of a large set of memory cells by implementing bit lines and separate negative bit lines. In one aspect, a negative bit line can be implemented to apply a negative voltage to a memory cell to improve a speed of writing data at the memory cell and the minimum voltage needed for the write. The success or failure of the write depends on the write capability. However, voltages provided to the memory cells coupled to the same bit line can be different, because of a high resistance (or a parasitic resistance) of the bit line. A large difference in negative voltages applied due to the resistance (or the parasitic resistance) of the bit line can cause different responses or behaviors of memory cells coupled to the same bit line. In one aspect, the disclosed memory device implements bit lines and separate negative bit lines, where negative bit lines may have lower resistances (or parasitic resistances) than the bit lines, such that the difference in negative voltages applied to memory cells through the negative bit lines can be reduced. By reducing the difference in negative voltages applied, data can be stored by memory cells with improved consistency and reliability.

In some embodiments, one or more components can be embodied as one or more transistors. The transistors in this disclosure are shown to have a certain type (N-type or P-type), but embodiments are not limited thereto. The transistors can be any suitable type of transistors including, but not limited to, metal oxide semiconductor field effect transistors (MOSFETs), bipolar junction transistors (BJTs), high voltage transistors, high frequency transistors, FinFETs, planar MOS transistors with raised source/drains, nanosheet FETs, nanowire FETs, or the like. Furthermore, one or more transistors shown or described herein can be embodied as two or more transistors connected in parallel. In one aspect, a transistor includes a source electrode, a drain electrode and a gate electrode. A source electrode and a drain electrode can be interchangeable, according to voltages applied to the source electrode and the drain electrode. Hence, a source electrode and a drain electrode can be each referred to as a source/drain electrode herein.

FIG. 1 is a diagram of a memory device 100, in accordance with one embodiment. In some embodiments, the memory device 100 includes a memory controller 105 and a memory array 120. The memory array 120 may include a plurality of storage circuits or memory cells 125 arranged in two- or three-dimensional arrays. Each memory cell 125 may be coupled to a corresponding word line WL and a corresponding bit line BL. The memory controller 105 may write data to or read data from the memory array 120 according to electrical signals through word lines WL and bit lines BL. In other embodiments, the memory device 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. The memory array 120 includes word lines WL0, WL1 . . . WLJ, each extending in a first direction (e.g., X-direction) and bit lines BL0, BL1 . . . BLK, each extending in a second direction (e.g., Y-direction). The word lines WL and the bit lines BL may be conductive metals or conductive rails. In one configuration, each memory cell 125 is coupled to a corresponding word line WL and a corresponding bit line BL, and can be operated according to voltages or currents through the corresponding word line WL and the corresponding bit line BL. In some embodiments, each bit line includes bit lines BL, BLB coupled to one or more memory cells 125 of a group of memory cells 125 disposed along the second direction (e.g., Y-direction). The bit lines BL, BLB may receive and/or provide differential signals. Each memory cell 125 may include a volatile memory, a non-volatile memory, or a combination of them. In some embodiments, each memory cell 125 is embodied as a static random access memory (SRAM) cell or other type of memory cell. In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line controller 112, a word line controller 114, and a timing controller 110. The bit line controller 112, the word line controller 114, and the timing controller 110 may be embodied as logic circuits, analog circuits, or a combination of them. In one configuration, the word line controller 114 is a circuit that provides a voltage or current through one or more word lines WL of the memory array 120, and the bit line controller 112 is a circuit that provides or senses a voltage or current through one or more bit lines BL of the memory array 120. In one configuration, the timing controller 110 is a circuit that provides control signals or clock signals to synchronize operations of the bit line controller 112 and the word line controller 114. In some embodiments, the timing controller 110 is embodied as or includes a processor and a non-transitory computer readable medium storing instructions when executed by the processor cause the processor to execute one or more functions of the timing controller 110 or the memory controller 105 described herein. The bit line controller 112 may be coupled to bit lines BL of the memory array 120, and the word line controller 114 may be coupled to word lines WL of the memory array 120. In some embodiments, the memory controller 105 includes more, fewer, or different components than shown in FIG. 1.

In one example, the timing controller 110 may generate control signals to coordinate operations of the bit line controller 112 and the word line controller 114. In one approach, to write data at a memory cell 125, the timing controller 110 may cause the word line controller 114 to apply a voltage or current to the memory cell 125 through a word line WL coupled to the memory cell 125 and cause the bit line controller 112 to apply a voltage or current corresponding to data to be stored to the memory cell 125 through a bit line BL coupled to the memory cell 125. In one approach, to read data from a memory cell 125, the timing controller 110 may cause the word line controller 114 to apply a voltage or current to the memory cell 125 through a word line WL coupled to the memory cell 125 and cause the bit line controller 112 to sense a voltage or current corresponding to data stored by the memory cell 125 through a bit line BL coupled to the memory cell 125.

Figure 2:
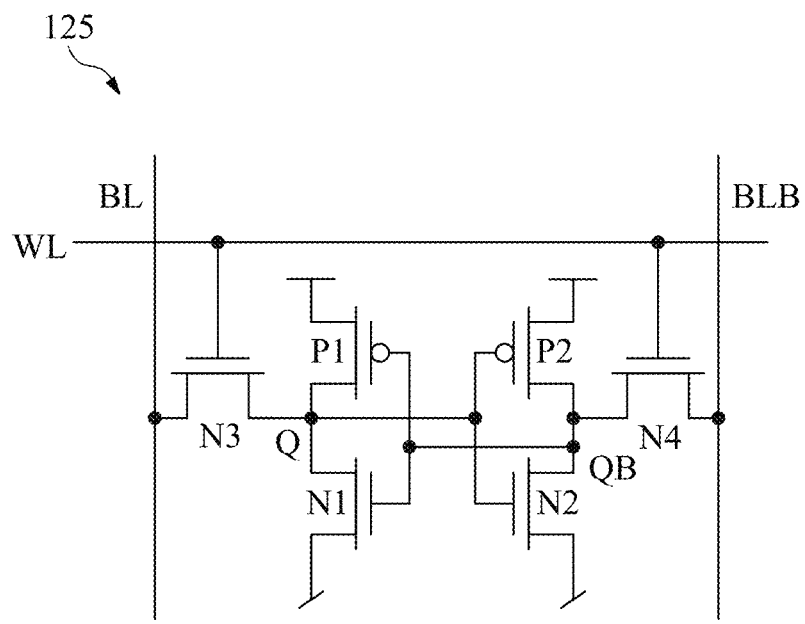
FIG. 2 is a schematic diagram of a static random access memory (SRAM) cell, in accordance with one embodiment.

FIG. 2 is a diagram of a SRAM cell 125, in accordance with one embodiment. In some embodiments, the SRAM cell 125 includes N-type transistors N1, N2, N3, N4 and P-type transistors P1, P2. The N-type transistors N1, N2, N3, N4 may be N-type metal-oxide-semiconductor field-effect transistors (MOSFET) or N-type fin field-effect transistors (FinFET). The P-type transistors P1, P2 may be P-type MOSFET or P-type FinFET. These components may operate together to store a bit. In other embodiments, the SRAM cell 125 includes more, fewer, or different components than shown in FIG. 2.

In one configuration, the N-type transistors N3, N4 include gate electrodes coupled to a word line WL. In one configuration, a drain electrode of the N-type transistor N3 is coupled to a bit line BL, and a source electrode of the N-type transistor N3 is coupled to a port Q. In one configuration, a drain electrode of the N-type transistor N4 is coupled to a bit line BLB, and a source electrode of the N-type transistor N4 is coupled to a port QB. In one aspect, the N-type transistors N3, N4 operate as electrical switches. The N-type transistors N3, N4 may allow the bit line BL to electrically couple to or decouple from the port Q and allow the bit line BLB to electrically couple to or decouple from the port QB, according to a voltage applied to the word line WL. For example, according to a supply voltage VDD (or 1V) corresponding to a high state (or logic value '1') applied to the word line WL, the N-type transistor N3 is enabled to electrically couple the bit line BL to the port Q and the N-type transistor N4 is enabled to electrically couple the bit line BLB to the port QB. For another example, according to a ground voltage VSS (or 0V) corresponding to a low state (or logic value '0') applied to the word line WL, the N-type transistor N3 is disabled to electrically decouple the bit line BL from the port Q and the N-type transistor N4 is disabled to electrically decouple the bit line BLB from the port QB.

In one configuration, the N-type transistor N1 includes a source electrode coupled to a first supply voltage rail supplying the ground voltage VSS or 0V, a gate electrode coupled to the port QB, and a drain electrode coupled to the port Q. In one configuration, the P-type transistor P1 includes a source electrode coupled to a second supply voltage rail supplying the supply voltage VDD, a gate electrode coupled to the port QB, and a drain electrode coupled to the port Q. In one configuration, the N-type transistor N2 includes a source electrode coupled to the first supply voltage rail supplying the ground voltage VSS or 0V, a gate electrode coupled to the port Q, and a drain electrode coupled to the port QB. In one configuration, the P-type transistor P2 includes a source electrode coupled to the second supply voltage rail supplying the supply voltage VDD, a gate electrode coupled to the port Q, and a drain electrode coupled to the port QB. In this configuration, the N-type transistor N1 and the P-type transistor P1 operate as an inverter, and the N-type transistor N2 and the P-type transistor P2 operate as an inverter, such that two inverters form cross-coupled inverters. In one aspect, the cross-coupled inverters may sense and amplify a difference in voltages at the ports Q, QB. When writing data, the cross-coupled inverters may sense voltages at the ports Q, QB provided through the N-type transistors N3, N4 and amplify a difference in voltages at the bit lines BL, BLB. For example, the cross-coupled inverters sense a voltage 0.5 V at the port Q and a voltage 0.4V at the port QB, and amplify a difference in the voltages at the ports Q, QB through a positive feedback (or a regenerative feedback) such that the voltage at the port Q becomes the supply voltage VDD (e.g., 1V) and the voltage at the port QB becomes the ground voltage VSS (e.g. 0V). The amplified voltages at the ports Q, QB may be provided to the bit lines BL, BLB through the N-type transistors N3, N4, respectively for reading.

Figure 3:
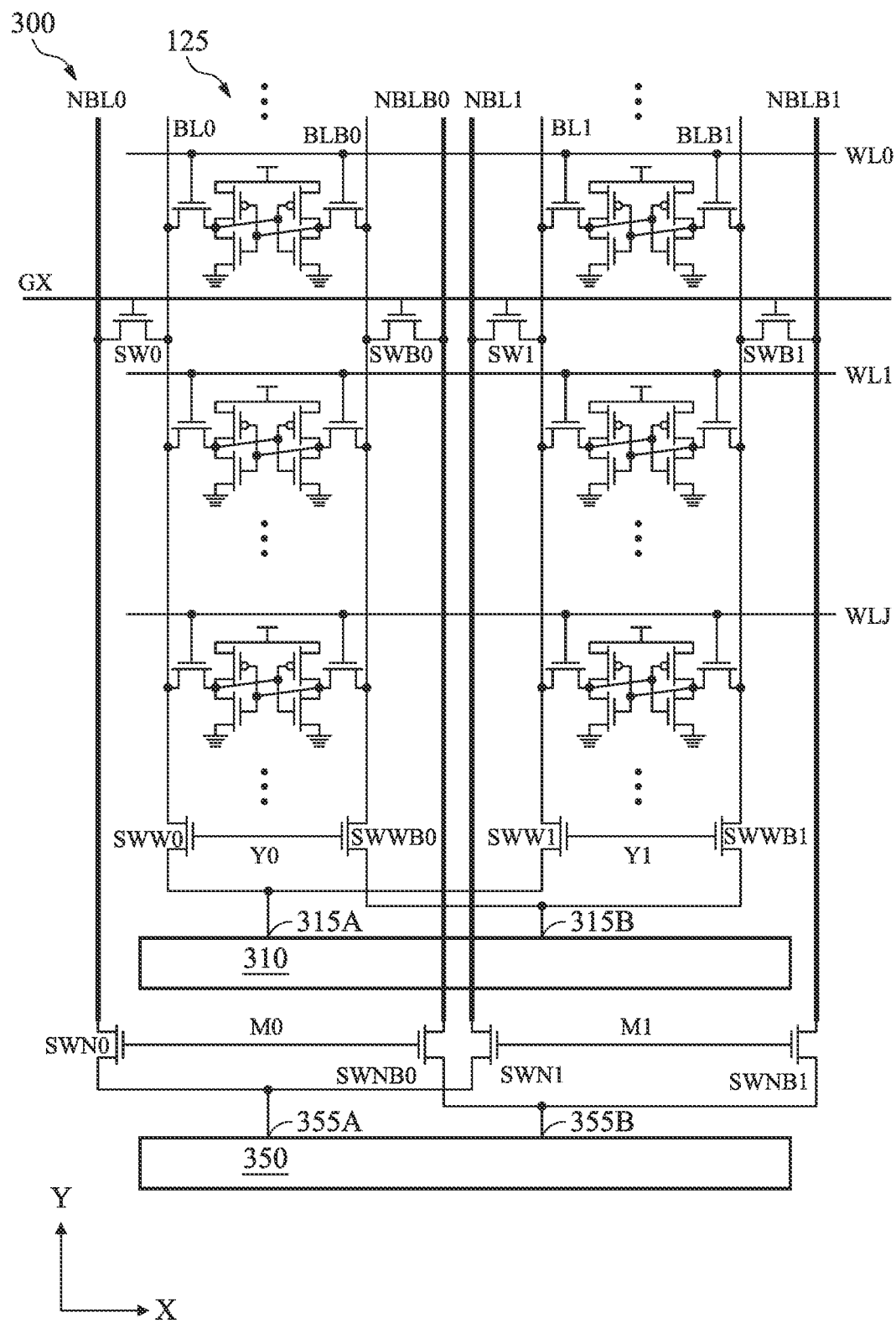
FIG. 3 is a schematic diagram of a portion of a memory device including a separate negative bit line, in accordance with one embodiment.

FIG. 3 is a schematic diagram of a portion 300 of a memory device 100 including separate negative bit lines NBL0, NBLB0, NBL1, NBLB1, in accordance with one embodiment. In some embodiments, the portion 300 of the memory device 100 includes memory cells 125, bit lines BL0, BLB0, BL1, BLB1, negative bit lines NBL0, NBLB0, NBL1, NBLB1, switches SW0, SWB0, SW1, SWB1, SWW0, SWWB0, SWW1, SWWB1, SWN0, SWNB0, SWN1, SWNB1, and driver circuits 310, 350. These components may operate together to write data at the memory cells 125. In one aspect, memory cells 125 in a first column are coupled to bit lines BL0, BLB0, and memory cells 125 in another column are coupled to bit lines BL1, BLB1. In some embodiments, the portion 300 of the memory device 100 includes more, fewer, or different components than shown in FIG. 3.

In some embodiments, the switches SW0, SWB0, SW1, SWB1 are circuits or components that can selectively couple negative bit lines NBL0, NBLB0, NBL1, NBLB1 to bit lines BL0, BLB0, BL1, BLB1, respectively. Each of the switches SW0, SWB0, SW1, SWB1 can be embodied as a transistor. For example, each of the switches SW0, SWB0, SW1, SWB1 can be an N-type transistor. In some embodiments, the switches SW0, SWB0, SW1, SWB1 can be implemented in the same layer as the memory cells 125. In some embodiments, the switches SW0, SWB0, SW1, SWB1 can be implemented in the memory array 120 or in the bit line controller 112. In one configuration, the switch SW0 includes a source electrode coupled to a negative bit line NBL0, a drain electrode coupled to a bit line BL0, and a gate electrode to receive a control signal GX. A control signal GX may be provided from the bit line controller 112 or the timing controller 110. In one configuration, the switch SWB0 includes a source electrode coupled to a negative bit line NBLB0, a drain electrode coupled to a bit line BLB0, and a gate electrode to receive the control signal GX. In one configuration, the switch SW1 includes a source electrode coupled to a negative bit line NBL1, a drain electrode coupled to a bit line BL1, and a gate electrode to receive the control signal GX. In one configuration, the switch SWB1 includes a source electrode coupled to a negative bit line NBLB1, a drain electrode coupled to a bit line BLB1, and a gate electrode to receive the control signal GX. In this configuration, the switches SW0, SWB0, SW1, SWB1 can be simultaneously enabled or disabled to selectively couple the negative bit lines NBL0, NBLB0, NBL1, NBLB1 to the bit lines BL0, BLB0, BL1, BLB1, respectively, according to the control signal GX. For example, in response to the control signal GX having a first voltage (e.g., VDD or 1V), the switches SW0, SWB0, SW1, SWB1 can be enabled to electrically couple the negative bit lines NBL0, NBLB0, NBL1, NBLB1 to the bit lines BL0, BLB0, BL1, BLB1, respectively. For example, in response to the control signal GX having a second voltage (e.g., VSS or 0V), the switches SW0, SWB0, SW1, SWB1 can be disabled to electrically decouple the negative bit lines NBL0, NBLB0, NBL1, NBLB1 from the bit lines BL0, BLB0, BL1, BLB1.

In some embodiments, the switches SWW0, SWWB0 are circuits or components that can selectively couple bit lines BL0, BLB0 to the driver circuit 310. Each of the switches SWW0, SWWB0 can be embodied as a transistor. For example, each of the switches SWW0, SWWB0 can be an N-type transistor. In some embodiments, the switches SWW0, SWWB0 can be implemented in the same layer as the memory cells 125. In some embodiments, the switches SWW0, SWWB0 can be implemented in the memory array 120 or in the bit line controller 112. In one configuration, the switch SWW0 includes a source electrode coupled to the driver circuit 310, a drain electrode coupled to the bit line BL0, and a gate electrode to receive a control signal Y0. A control signal Y0 may be provided from the bit line controller 112 or the timing controller 110. In one configuration, the switch SWWB0 includes a source electrode coupled to the driver circuit 310, a drain electrode coupled to the bit line BLB0, and a gate electrode to receive the control signal Y0. In this configuration, the switches SWW0, SWWB0 can be simultaneously enabled or disabled to selectively couple the bit lines BL0, BLB0 to the driver circuit 310, according to the control signal Y0. For example, in response to the control signal Y0 having a first voltage (e.g., VDD or 1V), the switches SWW0, SWWB0 can be enabled to electrically couple the bit lines BL0, BLB0 to the driver circuit 310. For example, in response to the control signal Y0 having a second voltage (e.g., VSS or 0V), the switches SWW0, SWWB0 can be disabled to electrically decouple the bit lines BL0, BLB0 from the driver circuit 310.

In some embodiments, the switches SWW1, SWWB1 are circuits or components that can selectively couple bit lines BL1, BLB1 to the driver circuit 310. Each of the switches SWW1, SWWB1 can be embodied as a transistor. For example, each of the switches SWW1, SWWB1 can be an N-type transistor. In some embodiments, the switches SWW1, SWWB1 can be implemented in the same layer as the memory cells 125. In some embodiments, the switches SWW1, SWWB1 can be implemented in the memory array 120 or in the bit line controller 112. In one configuration, the switch SWW1 includes a source electrode coupled to the driver circuit 310, a drain electrode coupled to the bit line BL1, and a gate electrode to receive a control signal Y1. A control signal Y1 may be provided from the bit line controller 112 or the timing controller 110. In one configuration, the switch SWWB1 includes a source electrode coupled to the driver circuit 310, a drain electrode coupled to the bit line BLB1, and a gate electrode to receive the control signal Y1. In this configuration, the switches SWW1, SWWB1 can be simultaneously enabled or disabled to selectively couple the bit lines BL1, BLB1 to the driver circuit 310, according to the control signal Y1. For example, in response to the control signal Y1 having a first voltage (e.g., VDD or 1V), the switches SWW1, SWWB1 can be enabled to electrically couple the bit lines BL1, BLB1 to the driver circuit 310. For example, in response to the control signal Y1 having a second voltage (e.g., VSS or 0V), the switches SWW1, SWWB1 can be disabled to electrically decouple the bit lines BL1, BLB1 from the driver circuit 310.

In some embodiments, negative bit lines NBL0, NBLB0, NBL1, NBLB1 are metal rails to provide a negative voltage to one or more memory cells 125. Negative bit lines NBL, NBLB may each have a lower resistance than bit lines BL, BLB. For example, negative bit lines NBL, NBLB may be disposed in a different layer (e.g., metal layer 1 or 2, or backside metal layer) than a layer (e.g., metal layer 0), in which bit lines BL, BLB are disposed. In one configuration, the negative bit lines NBL0, NBLB0, NBL1, NBLB1 extend along the Y-direction in parallel with the bit lines BL0, BLB0, BL1, BLB1. Through the negative bit lines NBL0, NBLB0, NBL1, NBLB1, the driver circuit 350 may provide negative voltages to the memory cells 125.

In some embodiments, the switches SWN0, SWNB0 are circuits or components that can selectively couple negative bit lines NBL0, NBLB0 to the driver circuit 350. Each of the switches SWN0, SWNB0 can be embodied as a transistor. For example, each of the switches SWN0, SWNB0 can be an N-type transistor. In some embodiments, the switches SWN0, SWNB0 can be implemented in the same layer as the memory cells 125. In some embodiments, the switches SWN0, SWNB0 can be implemented in the memory array 120 or in the bit line controller 112. In one configuration, the switch SWN0 includes a source electrode coupled to the driver circuit 350, a drain electrode coupled to the negative bit line NBL0, and a gate electrode to receive a control signal M0. A control signal M0 may be provided from the bit line controller 112 or the timing controller 110. In one configuration, the switch SWNB0 includes a source electrode coupled to the driver circuit 350, a drain electrode coupled to the negative bit line NBLB0, and a gate electrode to receive the control signal M0. In this configuration, the switches SWN0, SWNB0 can be simultaneously enabled or disabled to selectively couple the negative bit lines NBL0, NBLB0 to the driver circuit 350, according to the control signal M0. For example, in response to the control signal M0 having a first voltage (e.g., VDD or 1V), the switches SWN0, SWNB0 can be enabled to electrically couple the negative bit lines NBL0, NBLB0 to the driver circuit 350. For example, in response to the control signal M0 having a second voltage (e.g., VSS or 0V), the switches SWN0, SWNB0 can be disabled to electrically decouple the negative bit lines NBL0, NBLB0 from the driver circuit 350.

In some embodiments, the switches SWN1, SWNB1 are circuits or components that can selectively couple negative bit lines NBL1, NBLB1 to the driver circuit 350. Each of the switches SWN1, SWNB1 can be embodied as a transistor. For example, each of the switches SWN1, SWNB1 can be an N-type transistor. In some embodiments, the switches SWN1, SWNB1 can be implemented in the same layer as the memory cells 125. In some embodiments, the switches SWN1, SWNB1 can be implemented in the memory array 120 or in the bit line controller 112. In one configuration, the switch SWN1 includes a source electrode coupled to the driver circuit 350, a drain electrode coupled to the negative bit line NBL1, and a gate electrode to receive a control signal M1. A control signal M1 may be provided from the bit line controller 112 or the timing controller 110. In one configuration, the switch SWNB1 includes a source electrode coupled to the driver circuit 350, a drain electrode coupled to the negative bit line NBLB1, and a gate electrode to receive the control signal M1. In this configuration, the switches SWN1, SWNB1 can be simultaneously enabled or disabled to selectively couple the negative bit lines NBL1, NBLB1 to the driver circuit 350, according to the control signal M1. For example, in response to the control signal M1 having a first voltage (e.g., VDD or 1V), the switches SWN1, SWNB1 can be enabled to electrically couple the negative bit lines NBL1, NBLB1 to the driver circuit 350. For example, in response to the control signal M1 having a second voltage (e.g., VSS or 0V), the switches SWN1, SWNB1 can be disabled to electrically decouple the negative bit lines NBL1, NBLB1 from the driver circuit 350.

In some embodiments, the driver circuit 310 is a circuit or a component that can provide a voltage or a current to write data at one or more memory cells 125. In some embodiments, the driver circuit 310 is implemented in the bit line controller 112. In some embodiments, the driver circuit 310 can be replaced by a different circuit or a component that can perform the functionality of the driver circuit 310. In one configuration, the driver circuit 310 includes a first output port 315A coupled to the source electrode of the switch SWW0 and the source electrode of the switch SWW1. In one configuration, the driver circuit 310 includes a second output port 315B coupled to the source electrode of the switch SWWB0 and the source electrode of the switch SWWB1. In this configuration, the driver circuit 310 can provide a voltage or a current to write data through the output ports 315A, 315B. In one aspect, a voltage or current output at the first output port 315A and a voltage or current output at the second output port 315B are complementary with each other. For example, to write a bit '1', the driver circuit 310 may output a first voltage (e.g., VDD or 1V) at the first output port 315A, and may output a second voltage (e.g., VSS or 0V) at the second output port 315B. For example, to write a bit '0', the driver circuit 310 may output a second voltage (e.g., VSS or 0V) at the first output port 315A, and may output a first voltage (e.g., VDD or 1V) at the second output port 315B.

In some embodiments, the driver circuit 350 is a circuit or a component that can provide a negative voltage to assist writing data at one or more memory cells 125. In some embodiments, the driver circuit 350 is implemented in the bit line controller 112. In some embodiments, the driver circuit 350 can be replaced by a different circuit or a component that can perform the functionality of the driver circuit 350. In one configuration, the driver circuit 350 includes a first output port 355A coupled to the source electrode of the switch SWN0 and the source electrode of the switch SWN1. In one configuration, the driver circuit 350 includes a second output port 355B coupled to the source electrode of the switch SWNB0 and the source electrode of the switch SWNB1. In this configuration, the driver circuit 350 can provide a voltage to write data through the output ports 355A, 355B. In one aspect, a voltage output at the first output port 355A and a voltage output at the second output port 355B are complementary with each other. For example, to write a bit '1', the driver circuit 350 may output a first voltage (e.g., VDD or 1V) at the first output port 355A, and may output a third voltage (e.g., −0.3V) at the second output port 355B. For example, to write a bit '0', the driver circuit 350 may output a third voltage (e.g., −0.3V) at the first output port 355A, and may output a first voltage (e.g., VDD or 1V) at the second output port 355B.

In one aspect, the timing controller 110 or the bit line controller 112 can coordinate operations of the driver circuit 310, the driver circuit 350, and the switches SW0, SWB0, SW1, SWB1, SWW0, SWWB0, SWW1, SWWB1, SWN0, SWNB0, SWN1, SWNB1 to write data at one or more memory cells 125. For example, the timing controller 110 may configure or cause the driver circuit 310 to provide a voltage to write data at one or more memory cells 125 during a first time period, and configure or cause the driver circuit 350 to provide a negative voltage to assist writing the data at the one or more memory cells 125 during a second time period.

For example, during the first time period, to write data at a memory cell 125 coupled to the word line WL0 and bit lines BL0, BLB0, the timing controller 110 or the bit line controller 112 may enable the switches SWW0, SWWB0 and disable the switches SWW1, SWWB1, SWN0, SWNB0, SWN1, SWNB1. During the first time period, the word line controller 114 may apply a first voltage (e.g., VDD or 1V) to the word line WL0 and apply a second voltage (e.g., VSS or 0V) to other word lines WL1 . . . WLJ. During the first time period, the driver circuit 310 may provide the second voltage (e.g., VSS or 0V) at the first output port 315A and provide the first voltage (e.g., VDD or 1V) at the second output port 315B to write or program a bit '0'.

For example, to write data at the memory cell 125 coupled to the word line WL0 and bit lines BL0, BLB0, the timing controller 110 or the bit line controller 112 may enable the switches SWN0, SWNB0 and disable the switches SWW0, SWWB0, SWW1, SWWB1, SWN1, SWNB1 during the second time period. During the second time period, the word line controller 114 may apply a first voltage (e.g., VDD or 1V) to the word line WL0 and apply a second voltage (e.g., 0V) to other word lines WL1 . . . WLJ. During the second time period, the driver circuit 350 may output the third voltage (e.g., −0.3V) at the first output port 355A and output the first voltage (e.g., VDD or 1V) at the second output port 355B to write or program a bit '0'. By applying a negative voltage or the third voltage, the write operation can be performed faster.

Advantageously, by implementing bit lines BL0, BLB0, BL1, BLB1, and negative bit lines NBL0, NBLB0, NBL1, NBLB1, the memory device 100 can improve consistency and reliability of operation of a large set of memory cells 125. In one aspect, the bit lines BL0, BLB0, BL1, BLB1 may be implemented close to memory cells 125, and may allow fast reading operation. However, if the same bit lines BL0, BLB0, BL1, BLB1 are implemented to provide a negative voltage to perform a write operation, different negative voltages can be provided to memory cells coupled to the same bit lines BL0, BLB0, BL1, BLB1, because of a high resistance (or a parasitic resistance) of the bit lines BL0, BLB0, BL1, BLB1. A large difference in negative voltages applied due to the resistance (or the parasitic resistance) of the bit lines BL0, BLB0, BL1, BLB1 can cause different responses or behaviors of memory cells 125 coupled to the same bit lines BL0, BLB0, BL1, BLB1. For example, a write operation can be performed faster for a memory cell 125 disposed closer to the driver circuit 310 than a memory cell 125 disposed farther away from the driver circuit 310. In one aspect, negative bit lines NBL0, NBLB0, NBL1, NBLB1 may have lower resistances (or parasitic resistances) than the bit lines BL0, BLB0, BL1, BLB1 such that the difference in negative voltages applied to memory cells 125 through the negative bit lines NBL0, NBLB0, NBL1, NBLB1 can be reduced. By reducing the difference in negative voltages, data can be stored by memory cells 125 with improved consistency and reliability.

Figure 4:
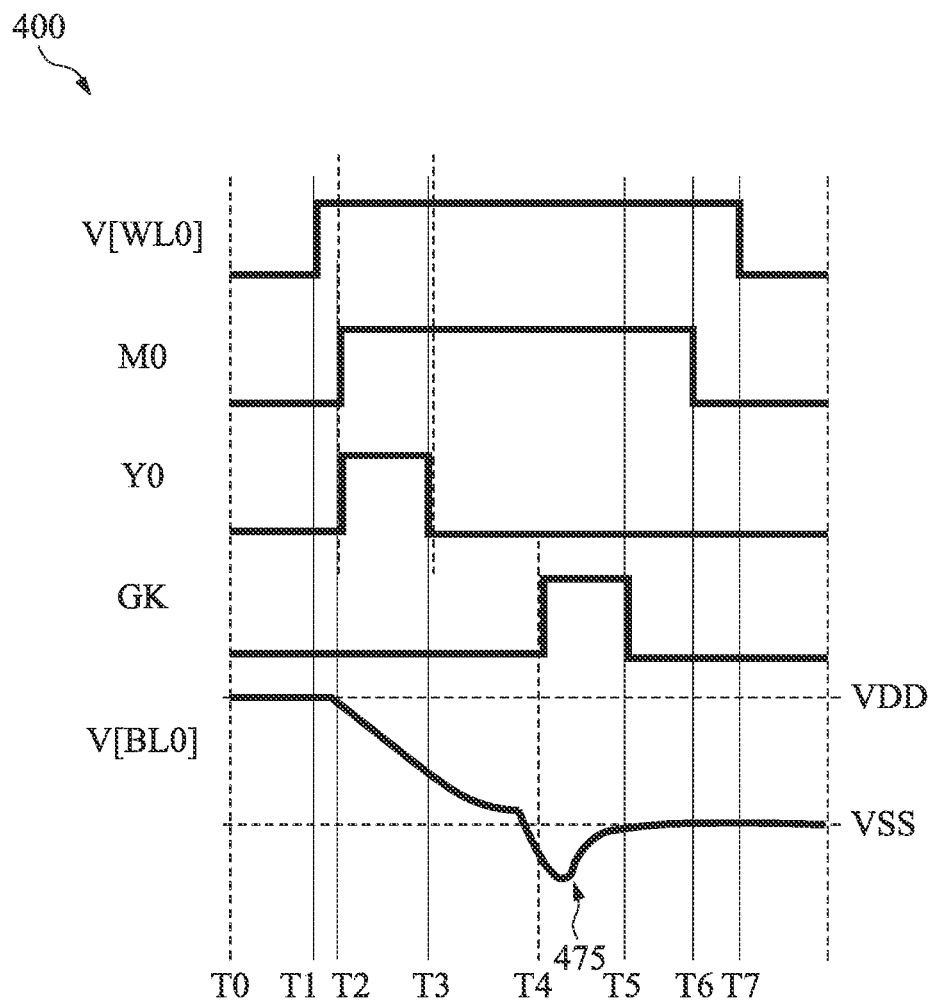
FIG. 4 is a timing diagram showing a write operation of a memory device including a bit line and a separate negative bit line, in accordance with one embodiment.

FIG. 4 is a timing diagram 400 showing a write operation of a memory device 100 including a bit line BL and a separate negative bit line NBL, in accordance with one embodiment. In some embodiments, the timing diagram 400 includes signals V[WL0], M0, Y0, GK, V[BL0]. The signal V[WL0] may be a voltage at the word line WL0. The control signal M0 may be a voltage applied to gate electrodes of switches SWN0, SWNB0. The control signal Y0 may be a voltage applied to gate electrodes of switches SWW0, SWWB0. The control signal GK may be a voltage applied to gate electrodes of switches SW0, SWB0. The voltage V[BL0] may be a voltage at the bit line BL0. In one aspect, signals or voltages can be applied as shown in the timing diagram 400 to perform a write operation to write a bit '0' at a selected memory cell 125 coupled to the word line WL0 and bit lines BL0, BLB0.

At time T0, the word line controller 114 may apply the control signal V[WL0] having a low voltage (e.g., VSS or 0V) to the word line WL0. At time T0, the timing controller 110 or the bit line controller 112 may apply the control signal M0 having a low voltage (e.g., VSS or 0V) to the gate electrodes of the switches SWN0, SWNB0, such that the switches SWN0, SWNB0 can be disabled. At time T0, the timing controller 110 or the bit line controller 112 may apply the control signal Y0 having a low voltage (e.g., VSS or 0V) to the gate electrodes of the switches SWW0, SWWB0, such that the switches SWW0, SWWB0 can be disabled. At time T0, the timing controller 110 or the bit line controller 112 may apply the control signal GK having a low voltage (e.g., VSS or 0V) to the gate electrodes of the switches SW0, SWB0, such that the switches SW0, SWB0 can be disabled. At time T0, the bit lines BL0, BLB0 may be preset or pre-charged to have a high voltage (e.g., VDD or 1V).

At time T1, the word line controller 114 may apply the control signal V[WL0] having a high voltage (e.g., VDD or 1V) to the word line WL0, such that transistors N3, N4 of the memory cell 125 coupled to the word line WL0 can be enabled.

At time T2, the timing controller 110 or the bit line controller 112 may apply the control signal M0 having a high voltage (e.g., VDD or 1V) to the gate electrodes of the switches SWN0, SWNB0, such that the switches SWN0, SWNB0 can be enabled. At time T2, the timing controller 110 or the bit line controller 112 may apply the control signal Y0 having a high voltage (e.g., VDD or 1V) to the gate electrodes of the switches SWW0, SWWB0, such that the switches SWW0, SWWB0 can be enabled. By enabling the transistors N3, N4 of the memory cell 125 coupled to the word line WL0 and enabling the switches SWW0, SWWB0 at time T2, the driver circuit 310 may apply a low voltage (e.g., VSS or 0V) such that the voltage V[BL0] at the bit line BL0 may decrease. While the switches SWN0, SWNB0 are enabled, the driver circuit 350 may apply a negative voltage (e.g., −0.3V) at the first output port 355A and a high voltage (e.g., VDD or 1V) at the second output port 355B at time T2, such that the negative bit line NBL0 can be precharged to have the negative voltage (e.g., −0.3V) and the negative bit line NBLB0 can have the high voltage (e.g., VDD or 1V). Because the switches SW0, SWB0 are disabled at time T2, the negative voltage at the negative bit line NBL0 may not affect the voltages at the bit lines BL0, BLB0.

At time T3, the timing controller 110 or the bit line controller 112 may apply the control signal Y0 having a low voltage (e.g., VSS or 0V) to the gate electrodes of the switches SWW0, SWWB0, such that the switches SWW0, SWWB0 can be disabled. Meanwhile, the transistors N3, N4 of the memory cell 125 coupled to the word line WL0 are enabled at time T3, such that the voltage at the bit line BL may continue to decrease through the positive feedback of the memory cell 125.

At time T4, the timing controller 110 or the bit line controller 112 may apply the control signal GK having a high voltage (e.g., VDD or 1V) to the gate electrodes of the switches SW0, SWB0, such that the switches SW0, SWB0 can be enabled. By enabling the switches SW0, SWB0 at time T4, the negative voltage at the negative bit line NBL0 can be applied to the bit line BL0, such that the bit line BL0 may have a negative voltage 475.

At time T5, the timing controller 110 or the bit line controller 112 may apply the control signal GK having a low voltage (e.g., VSS or 0V) to the gate electrodes of the switches SW0, SWB0, such that the switches SW0, SWB0 can be disabled. By disabling the switches SW0, SWB0 at time T5, the negative bit lines NBL0, NBLB0 may be electrically decoupled from the bit lines BL0, BLB0, such that the bit line BL0 may have a second voltage (e.g., VSS or 0V).

At time T6, the timing controller 110 or the bit line controller 112 may apply the control signal M0 having a low voltage (e.g., VSS or 0V) to the gate electrodes of the switches SWN0, SWNB0, such that the switches SWN0, SWNB0 can be disabled. By disabling the switches SWN0, SWNB0 at time T6, the negative bit lines NBL0, NBLB0 may be electrically decoupled from the driver circuit 350.

At time T7, the timing controller 110 or the bit line controller 112 may apply the control signal V[WL0] having a low voltage (e.g., VSS or 0V) to the word line WL0, such that transistors N3, N4 of the memory cell 125 coupled to the word line WL0 can be disabled to complete the writing operation.

Figure 5:
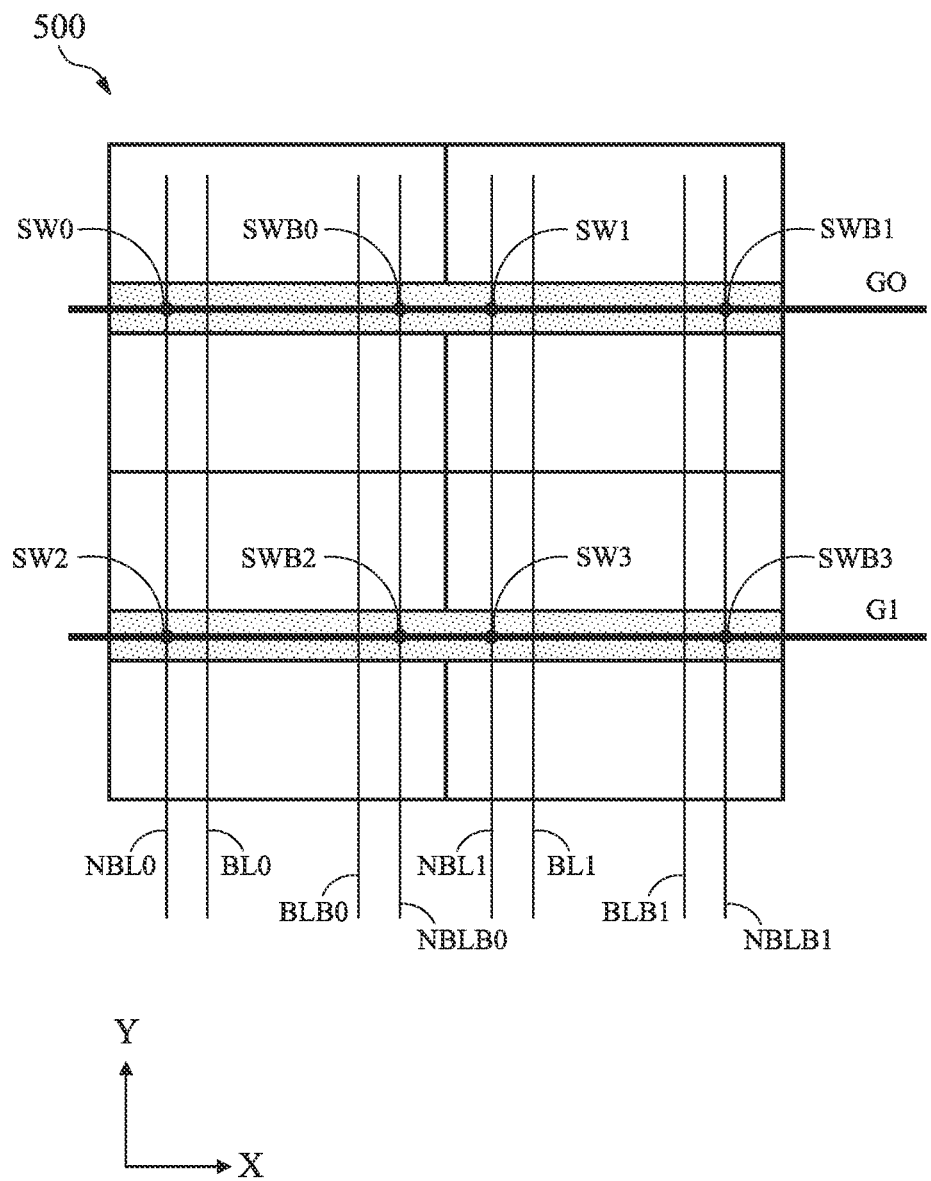
FIG. 5 is a diagram showing a portion of a memory device including negative bit lines and switches to selectively couple the negative bit lines to corresponding bit lines, in accordance with one embodiment.

FIG. 5 is a diagram showing a portion 500 of a memory device 100 including negative bit lines NBL0, NBLB0, NBL1, NBLB1 and switches SW0, SWB0, SW1, SWB1, SW2, SWB2, SW3, SWB3 to selectively couple the negative bit lines NBL0, NBLB0, NBL1, NBLB1 to corresponding bit lines BL0, BLB0, BL1, BLB1, in accordance with one embodiment. In one aspect, the portion 500 of the memory device 100 is similar to the portion 300 of the memory device 100 of FIG. 3, except that i) the switches SWW0, SWWB0, SWW1, SWWB1, SWN0, SWNB0, SWN1, SWNB1 and the driver circuits 310, 350 are not shown for simplicity, and ii) additional switches SW2, SWB2, SW3, SWB3 are provided to selectively couple the negative bit lines NBL0, NBLB0, NBL1, NBLB1 to the bit lines BL0, BLB0, BL1, BLB1, respectively. Thus, detailed description on duplicated portion thereof is omitted herein for the sake of brevity. In one aspect, the switches SW0, SWB0, SW1, SWB1 are controlled according to a control signal G0, and the switches SW2, SWB2, SW3, SWB3 are controlled according to a control signal G1. In one aspect, a number of memory cells 125 can be disposed along the Y-direction between the switches SW0, SW2, between the switches SWB0, SWB2, between the switches SW1, SWB3, and between the switches SWB1, SWB3. The switches SW2, SWB2, SW3, SWB3 can be implemented to further reduce a resistance of providing a negative voltage to memory cells 125. By reducing a resistance of providing a negative voltage to memory cells 125, difference in negative voltages applied can be reduced, such that data can be stored by memory cells 125 with improved consistency and reliability.

Figure 6:
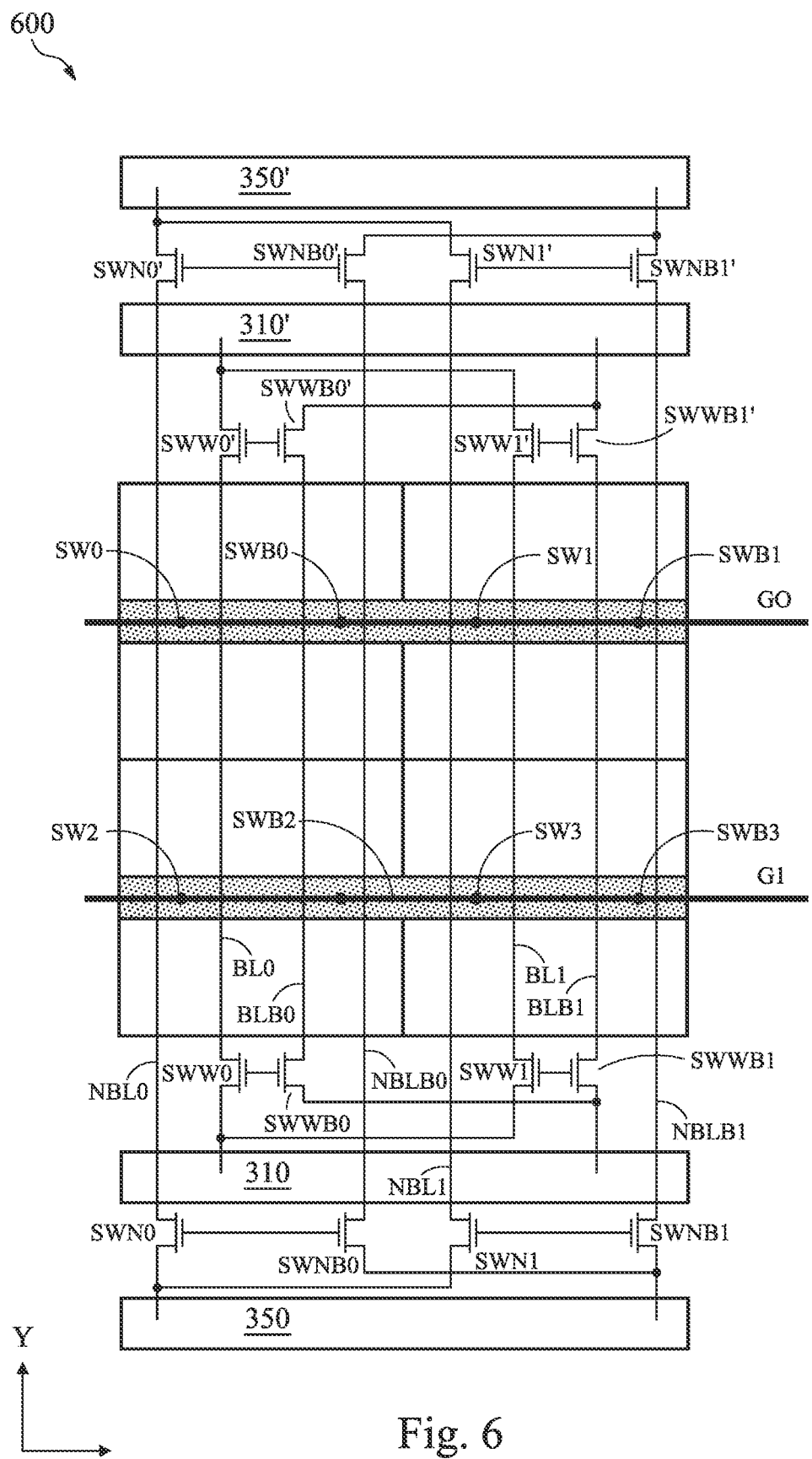
FIG. 6 is a diagram showing additional driver circuits to drive bit lines and separate negative bit lines, in accordance with one embodiment.

FIG. 6 is a diagram showing a portion 600 of the memory device 100 including additional driver circuits 310', 350' to drive bit lines BL0, BLB0, BL1, BLB1 and separate negative bit lines NBL0, NBLB0, NBL1, NBLB1, in accordance with one embodiment. In one aspect, the portion 600 of the memory device 100 is similar to the portion 300 of the memory device 100, except that additional driver circuits 310', 350' and switches SWN0', SWNB0' SWN1', SWNB1', SWW0', SWWB0', SWW1', SWWB1', SW2, SWB2, SW3, SWB3 are provided. The additional driver circuits 310', 350' and switches SWN0', SWNB0', SWN1', SWNB1', SWW0', SWWB0', SWW1', SWWB1' may be configured and operate in a similar manner as the driver circuits 310, 350 and switches SWN0, SWNB0, SWN1, SWNB1, SWW0, SWWB0, SWW1, SWWB1, respectively. The switches SW2', SWB2', SW3', SWB3' may be similar to the switches SW2, SWB2, SW3, SWB3 in the portion 500 of the memory device 100 of FIG. 5. Thus, detailed description on duplicated portion thereof is omitted herein for the sake of brevity. In one configuration, the driver circuits 310, 350 can be disposed at a first end of memory cells 125, where the driver circuits 310', 350' can be disposed at a second end of memory cells 125, such that the memory cells 125 can be disposed between the driver circuits 310, 350 and the driver circuits 310', 350' along the Y-direction. By implementing additional driver circuits 310', 350' and switches SWN0', SWNB0', SWN1', SWNB1', SWW0', SWWB0', SWW1', SWWB1', a resistance of providing a negative voltage to memory cells 125 can be further reduced. By reducing a resistance of providing a negative voltage to memory cells 125, difference in negative voltages applied can be reduced, such that data can be stored by memory cells 125 with improved consistency and reliability.

FIG. 7 is a flowchart showing a method 700 of operating a memory device (e.g., memory device 100) including separate negative bit lines (e.g., NBL0, NBLB0, NBL1, NBLB1), in accordance with some embodiments. In some embodiments, the method 700 is performed by a controller (e.g., memory controller 105). In some embodiments, the method 700 is performed by other entities. In some embodiments, the method 700 is performed to write data at a selected memory cell. In some embodiments, the method 700 includes more, fewer, or different steps than shown in FIG. 7. In some embodiments, the method 700 can be performed in a different order than shown in FIG. 7.

In one approach, the controller disables 710 a switch (e.g., switch SW0) coupled between a first bit line (e.g., bit line BL0) and a second bit line (e.g., negative bit line NBL0) during a first time period. The first bit line may be coupled to a set of memory cells 125 disposed along a direction (e.g., column direction). In one aspect, the second bit line may have a lower resistance than the first bit line. In some embodiments, the negative bit lines NBL, NBLB may each have a 2X to 10X lower resistance (e.g., resistance per unit length) than bit lines BL, BLB, or any of other various values. For example, the second bit line may be disposed in a different layer (e.g., metal layer 1, metal layer 2, or backside metal rail) than a layer (e.g., metal layer 0), in which the first bit line is disposed. By disabling the switch, the second bit line can be electrically decoupled from the first bit line and the set of memory cells 125.

In one approach, the controller applies 720 a data voltage to a selected memory cell 125 through the first bit line during the first time period. The data voltage may be a voltage representing a bit. For example, the data voltage may be a ground voltage (e.g., VSS or 0V) to represent a bit '0'. After the first time period, the controller may stop applying the data voltage to the first bit line.

In one approach, the controller enables 730 the switch during a second time period after the first time period. By enabling the switch, the second bit line can be electrically coupled to the first bit line.

In one approach, the controller applies 740 an assist voltage lower than the data voltage to the selected memory cell 125 through the second bit line, the switch and the first bit line during the second time period. The assist voltage may be a voltage applied to assist writing data at a memory cell 125 or improve a writing speed. For example, the assist voltage may be a negative voltage below 0V (e.g., −0.3V). By applying the assist voltage (or the negative voltage), the speed of performing a write operation can be improved.

Advantageously, by applying the assist voltage (or a negative voltage) through the second bit line (e.g., negative bit line) separate from the first bit line (e.g., bit line), the memory device 100 can improve consistency and reliability of operation of a large set of memory cells 125. In one aspect, the first bit line (e.g., bit lien BL0) may be implemented close to memory cells 125, and may allow fast reading operation. However, if the first bit line is implemented to provide both the data voltage and the assist voltage to perform a write operation, different voltages can be provided to memory cells 125 coupled to the first bit line, because of a resistance (or a parasitic resistance) of the first bit line. A large difference in voltages applied due to the resistance (or the parasitic resistance) of the first bit line can cause different responses or behaviors of memory cells 125 coupled to the same first bit line. For example, a write operation can be performed faster for a memory cell 125 disposed closer to the driver circuit 310 than a memory cell 125 disposed farther away from the driver circuit 310. In one aspect, a separate second bit line (or negative bit line) having a lower resistance (or parasitic resistance) than the first bit line can be implemented to provide the assist voltage (or the negative voltage), such that the difference in voltages applied to memory cells 125 through the second bit line can be reduced. By reducing the difference in voltages applied through the second bit line, data can be stored by memory cells 125 with improved consistency and reliability.

Figure 8:
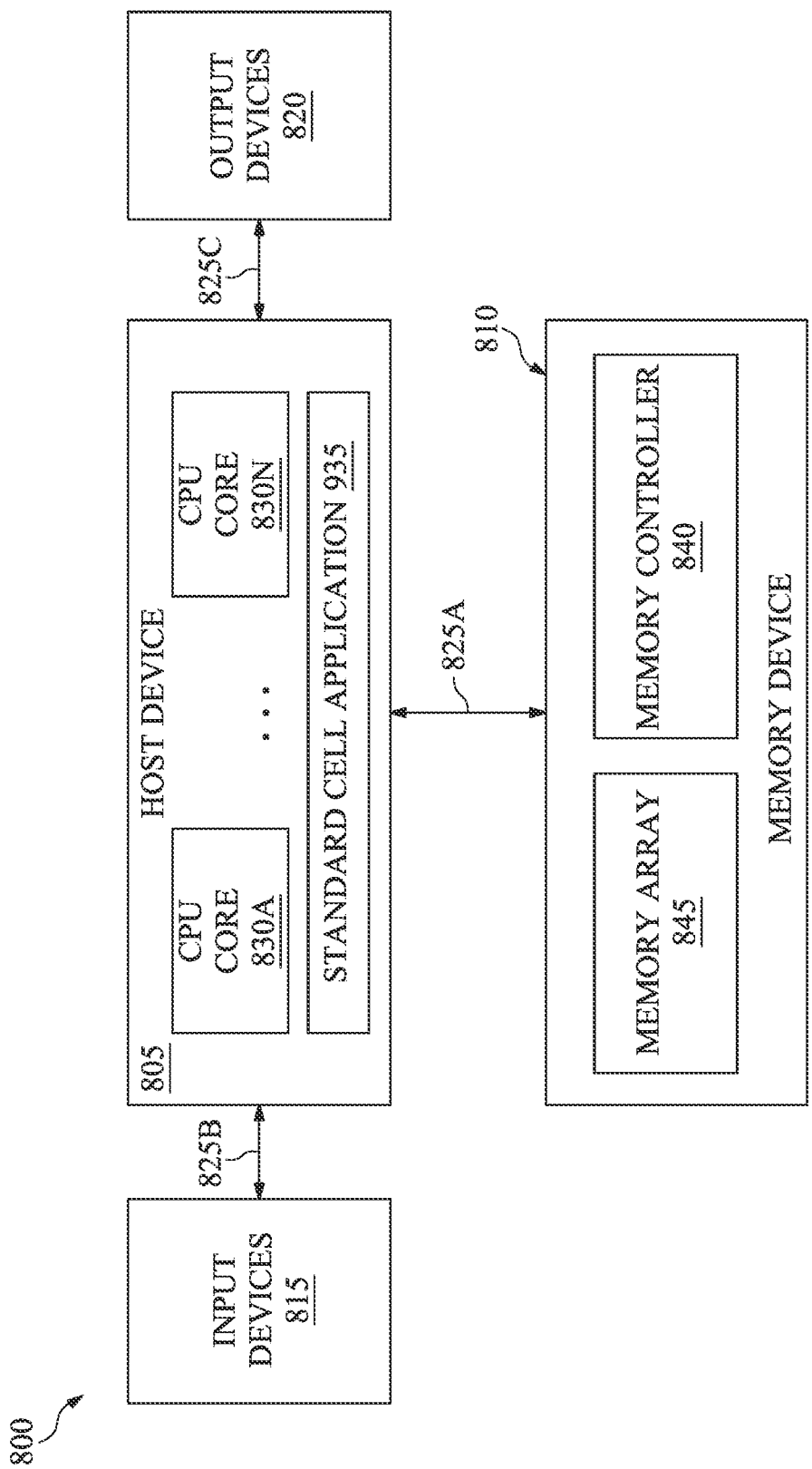
FIG. 8 is an example block diagram of a computing system, in accordance with some embodiments.

Referring now to FIG. 8, an example block diagram of a computing system 800 is shown, in accordance with some embodiments of the disclosure. The computing system 800 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 800 includes a host device 805 associated with a memory device 810. The host device 805 may be configured to receive input from one or more input devices 815 and provide output to one or more output devices 820. The host device 805 may be configured to communicate with the memory device 810, the input devices 815, and the output devices 820 via appropriate interfaces 825A, 825B, and 825C, respectively. The computing system 800 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 805.

The input devices 815 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 805 and that allows an external source, such as a user (e.g., a circuit or layout designer), to enter information (e.g., data) into the host device and send instructions to the host device. Similarly, the output devices 820 may include a variety of output technologies such as external memories, printers, speakers, displays, microphones, light emitting diodes, headphones, video devices, and any other output peripherals that are configured to receive information (e.g., data) from the host device 805. The "data" that is either input into the host device 805 and/or output from the host device may include any of a variety of textual data, circuit data, signal data, semiconductor device data, graphical data, combinations thereof, or other types of analog and/or digital data that is suitable for processing using the computing system 800.

The host device 805 includes or is associated with one or more processing units/processors, such as Central Processing Unit ("CPU") cores 830A . . . 830N. The CPU cores 830A . . . 830N may be implemented as an Application Specific Integrated Circuit ("ASIC"), Field Programmable Gate Array ("FPGA"), or any other type of processing unit. Each of the CPU cores 830A . . . 830N may be configured to execute instructions for running one or more applications of the host device 805. In some embodiments, the instructions and data to run the one or more applications may be stored within the memory device 810. The host device 805 may also be configured to store the results of running the one or more applications within the memory device 810. Thus, the host device 805 may be configured to request the memory device 810 to perform a variety of operations. For example, the host device 805 may request the memory device 810 to read data, write data, update or delete data, and/or perform management or other operations. One such application that the host device 805 may be configured to run may be a standard cell application 835. The standard cell application 835 may be part of a computer aided design or electronic design automation software suite that may be used by a user of the host device 805 to use, create, or modify a standard cell of a circuit. In some embodiments, the instructions to execute or run the standard cell application 835 may be stored within the memory device 810. The standard cell application 835 may be executed by one or more of the CPU cores 830A . . . 830N using the instructions associated with the standard cell application from the memory device 810. In one example, the standard cell application 835 allows a user to utilize pre-generated schematic and/or layout designs of the memory device 100 or a portion of the memory device 100 to aid integrated circuit design. After the layout design of the integrated circuit is complete, multiples of the integrated circuit, for example, including the memory device 100, or any portion of the memory device 100 can be fabricated according to the layout design by a fabrication facility.

Referring still to FIG. 8, the memory device 810 includes a memory controller 840 that is configured to read data from or write data to a memory array 845. The memory array 845 may include a variety of volatile and/or non-volatile memories. For example, in some embodiments, the memory array 845 may include NAND flash memory cores. In other embodiments, the memory array 845 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 845 may be individually and independently controlled by the memory controller 840. In other words, the memory controller 840 may be configured to communicate with each memory within the memory array 845 individually and independently. By communicating with the memory array 845, the memory controller 840 may be configured to read data from or write data to the memory array in response to instructions received from the host device 805. Although shown as being part of the memory device 810, in some embodiments, the memory controller 840 may be part of the host device 805 or part of another component of the computing system 800 and associated with the memory device 810. The memory controller 840 may be implemented as a logic circuit in either software, hardware, firmware, or combination thereof to perform the functions described herein. For example, in some embodiments, the memory controller 840 may be configured to retrieve the instructions associated with the standard cell application 835 stored in the memory array 845 of the memory device 810 upon receiving a request from the host device 805.

It is to be understood that only some components of the computing system 800 are shown and described in FIG. 8. However, the computing system 800 may include other components such as various batteries and power sources, networking interfaces, routers, switches, external memory systems, controllers, etc. Generally speaking, the computing system 800 may include any of a variety of hardware, software, and/or firmware components that are needed or considered desirable in performing the functions described herein. Similarly, the host device 805, the input devices 815, the output devices 820, and the memory device 810 including the memory controller 840 and the memory array 845 may include other hardware, software, and/or firmware components that are considered necessary or desirable in performing the functions described herein.

In one aspect of the present disclosure, a memory device is disclosed. In some embodiments, the memory device includes a set of memory cells. In some embodiments, the memory device includes a first bit line extending along a direction. In some embodiments, the first bit line is coupled to a subset of the set of memory cells disposed along the direction. In some embodiments, the memory device includes a second bit line extending along the direction. In some embodiments, the memory device includes a switch coupled between the first bit line and the second bit line.

In another aspect of the present disclosure, a memory device is disclosed. In some embodiments, the memory device includes a first bit line coupled to a set of memory cells. In some embodiments, the memory device includes a second bit line. In some embodiments, the memory device includes a switch to selectively couple the first bit line and the second bit line. In some embodiments, the second bit line has a lower resistance than the first bit line.

In yet another aspect of the present disclosure, a method of operating a memory device is disclosed. In some embodiments, the method includes disabling, by a controller, a switch coupled between a first bit line and a second bit line during a first time period. The first bit line may be coupled to a set of memory cells. In some embodiments, the method includes applying, by the controller, a first voltage to a memory cell of the set of memory cells through the first bit line. In some embodiments, the method includes enabling, by the controller, the switch during a second time period. In some embodiments, the method includes applying, by the controller, a second voltage lower than the first voltage to the memory cell of the set of memory cells through the second bit line, the switch and the first bit line.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a set of memory cells;
a first bit line extending along a direction, the first bit line coupled to a subset of the set of memory cells disposed along the direction, wherein the first bit line is configured to be applied with a positive voltage;
a second bit line extending along the direction, wherein the second bit line is configured to be applied with a negative voltage; and
a switch coupled between the first bit line and the second bit line, wherein the switch is configured to selectively connect the second bit line to the first bit line for applying the negative voltage during the write operation while maintaining positive voltage on an unselected subset of memory cells coupled to the first bit line.

2. The device of claim 1, wherein the second bit line has a lower resistance than the first bit line.

3. The device of claim 1,
wherein the first bit line is disposed in a first layer, and
wherein the second bit line is disposed in a second layer.

4. The device of claim 3, wherein the set of memory cells is disposed in a third layer.

5. The device of claim 4, wherein the third layer is between the first layer and the second layer.

6. The device of claim 4, wherein the first layer is between the second layer and the third layer.

7. The device of claim 1, further comprising:
a driver circuit to:
- apply, during a first time period, a first voltage to a memory cell of the set of memory cells through the first bit line to write data at the memory cell, and
- apply, during a second time period, a second voltage lower than the first voltage to the memory cell of the set of memory cells through the second bit line, the switch, and the first bit line to write the data to the memory cell.

8. The device of claim 7,
wherein the switch is disabled during the first time period, and
wherein the switch is enabled during the second time period.

9. The device of claim 7,
wherein the subset of the set of memory cells includes a first memory cell and a second memory cell,
wherein the first memory cell is closer to the switch than the second memory cell, and
wherein the second memory cell is closer to the driver circuit than the first memory cell.

10. The device of claim 7, further comprising:
another driver circuit to:
- apply, during the first time period, the first voltage to the memory cell of the set of memory cells through the first bit line to write the data to the memory cell, and
- apply, during the second time period, the second voltage lower than the first voltage to the memory cell of the set of memory cells through the second bit line, the switch, and the first bit line to write the data to the memory cell, wherein a first portion of the subset of the set of memory cells is disposed between the driver circuit and the switch, and
wherein a second portion of the subset of the set of memory cells is disposed between the another driver circuit and the switch.

11. A device comprising:
a first bit line coupled to a set of memory cells;
a second bit line;
a switch to selectively couple the first bit line and the second bit line; and
a controller configured to:
- control the switch to couple the second bit line to the first bit line during a write operation to a selected memory cell of the set of memory cells;
- apply a negative voltage from the second bit line to the first bit line during the write operation while the switch is coupled; and
- maintain a positive voltage on the first bit line for unselected memory cells of the set of memory cells during the write operation; wherein the second bit line has a two times lower resistance than the first bit line.

12. The device of claim 11,
wherein the first bit line is disposed in a first layer, and
wherein the second bit line is disposed in a second layer.

13. The device of claim 12, wherein the set of memory cells is disposed in a third layer.

14. The device of claim 13, wherein the third layer is between the first layer and the second layer.

15. The device of claim 13, wherein the first layer is between the second layer and the third layer.

16. The device of claim 11, further comprising:
a driver circuit to:
- apply, during a first time period, a first voltage to a memory cell of the set of memory cells through the first bit line to write data at the memory cell, and
- apply, during a second time period, a second voltage lower than the first voltage to the memory cell of the set of memory cells through the second bit line, the switch, and the first bit line to write the data to the memory cell.

17. The device of claim 16,
wherein the switch is disabled during the first time period, and
wherein the switch is enabled during the second time period.

18. A method comprising:
disabling, by a controller, a switch coupled between a first bit line and a second bit line during a first time period, the first bit line coupled to a set of memory cells, wherein the second bit line has a lower resistance than the first bit line;
applying, by the controller, a positive first voltage to a memory cell of the set of memory cells through the first bit line during the first time period to write data to the memory cell;
enabling, by the controller, the switch during a second time period after stopping application of the positive first voltage; and
applying, by the controller, a negative second voltage to the memory cell of the set of memory cells through the second bit line, the switch and the first bit line during the second time period to assist writing the data to the memory cell.

19. The method of claim 18, wherein the second bit line has a lower resistance than the first bit line.

20. The method of claim 18,
wherein the first bit line is disposed in a first layer,
wherein the second bit line is disposed in a second layer,
wherein the set of memory cells is disposed in a third layer, and
wherein the first layer is between the second layer and the third layer.

* * * * *